(12) United States Patent
You

(10) Patent No.: US 7,429,760 B2
(45) Date of Patent: Sep. 30, 2008

(54) VARIABLE MASK DEVICE FOR CRYSTALLIZING SILICON LAYER

(75) Inventor: JaeSung You, Seoul (KR)

(73) Assignee: LG Display Co., Ltd., Seoul (KR)

( * ) Notice: Subject to any disclaimer, the term of this patent is extended or adjusted under 35 U.S.C. 154(b) by 32 days.

(21) Appl. No.: 11/172,480

(22) Filed: Jun. 30, 2005

(65) Prior Publication Data

US 2006/0035478 A1 Feb. 16, 2006

(30) Foreign Application Priority Data

Aug. 10, 2004 (KR) ............... 10-2004-0062892

(51) Int. Cl.
 *H01L 29/74* (2006.01)
 *H01L 31/111* (2006.01)
(52) U.S. Cl. ............... 257/148; 257/726; 438/795; 359/368
(58) Field of Classification Search ............... 257/148, 257/E21.134, 726–727; 359/368, 388, 738, 359/740; 438/795, 798
 See application file for complete search history.

(56) References Cited

U.S. PATENT DOCUMENTS

| | | | | |
|---|---|---|---|---|
| 3,736,425 A * | 5/1973 | Chernow | ............... | 250/492.1 |
| 4,338,654 A * | 7/1982 | Logothetis | ............... | 362/268 |
| 4,468,720 A * | 8/1984 | Arai | ............... | 362/281 |
| 5,347,134 A * | 9/1994 | Hashimoto et al. | ....... | 250/492.1 |
| 5,523,574 A * | 6/1996 | Hamada et al. | .......... | 250/492.2 |
| 5,744,859 A * | 4/1998 | Ouchida | ............... | 257/668 |
| 6,891,671 B1 * | 5/2005 | Greenberg | ............... | 359/388 |
| 2001/0000243 A1 | 4/2001 | Sugano et al. | | |
| 2003/0184722 A1 | 10/2003 | Kyusho et al. | | |
| 2003/0211714 A1 | 11/2003 | Yamazaki et al. | | |
| 2003/0228723 A1 | 12/2003 | Yamazaki et al. | | |
| 2004/0072411 A1 | 4/2004 | Azami et al. | | |

FOREIGN PATENT DOCUMENTS

CN 1514469 A 7/2004

(Continued)

OTHER PUBLICATIONS

Office Action dated Mar. 31, 2006 for corresponding Korean Application No. 10-2004-0062892.
Office Action dated Jul. 4, 2006 from the Taiwanese Patent Office for corresponding application No. 094121631.

(Continued)

*Primary Examiner*—Phuc T Dang
(74) *Attorney, Agent, or Firm*—Brinks Hofer Gilson & Lione

(57) ABSTRACT

Disclosed are a variable mask device for crystallizing a silicon layer capable of controlling a width and a length of an opening, and a method for crystallizing a silicon using the variable mask device. The variable mask device has a frame with an opening whose width is controlled by an X direction actuator and whose length is controlled by a Y direction actuator. A substrate on which a plurality of unit liquid crystal display panels are formed is provided. A laser beam is aligned through the opening and the silicon layer formed on the substrate is irradiated with the laser beam, thereby crystallizing the silicon layer. The substrate is moved in an X direction by scanning distance and the silicon layer is irradiated until the silicon layer is entirely crystallized.

7 Claims, 6 Drawing Sheets

FOREIGN PATENT DOCUMENTS

| | | |
|---|---|---|
| EP | 1326273 | 7/2003 |
| JP | 58-138588 | 8/1983 |
| JP | 200208769 | 7/2000 |
| JP | 2002-237455 | 8/2002 |
| JP | 2004-88084 | 3/2004 |
| KR | 2000-0076463 | 12/2000 |

OTHER PUBLICATIONS

Search and Examination Report dated Feb. 1, 2007 for corresponding British Patent Application No. 0624768.8.

Office Action for corresponding Chinese Patent Application Serial No. 200510079644.5 dated Jun. 8, 2007.

* cited by examiner

VARIABLE MASK DEVICE FOR CRYSTALLIZING SILICON LAYER

PRIORITY CLAIM

This application claims the benefit of Korean Patent Application No. P2004-62892 filed on Aug. 10, 2004, which is hereby incorporated by reference.

TECHNICAL FIELD

The present invention relates to a device for crystallizing amorphous silicon, and more particularly, to a variable mask device for crystallizing a silicon layer applied to a sequential lateral solidification (SLS) method.

BACKGROUND

An amorphous silicon thin film transistor (a-Si TFT) has been widely used as a switching device of an image display device such as a liquid crystal display (LCD) device, etc. However, recently, research for using a polycrystalline silicon (hereinafter, polysilicon or poly-Si) TFT having an operation speed faster than that of the amorphous silicon TFT as a switching device has been actively pursued as the desire for high picture quality LCDs has increased.

To fabricate a polysilicon TFT, a polysilicon layer may be formed by heat treating an amorphous silicon layer. Either a high temperature furnace or an excimer laser may be used to provide the heat treatment.

However, since an LCD uses a glass substrate, which is deformed at a temperature of greater than 600° C., it is difficult to crystallize an amorphous silicon layer on the glass substrate in a high temperature furnace. Accordingly, crystallization using an excimer laser is generally used. The excimer laser irradiates the amorphous silicon layer using a high energy laser beam. The laser provides instantaneous heating over several tens of nanoseconds, which is short enough to allow the glass substrate to remain substantially unaffected.

Another benefit of using an excimer laser to form the polysilicon layer is that the polysilicon layer has a higher electron mobility than that of a polysilicon layer formed by a furnace heat treatment. Generally, amorphous silicon has an electron mobility of 0.1~0.2 $cm^2$/Vsec. Whereas polysilicon formed by a furnace heat treatment has an electron mobility of 10~20 $cm^2$/Vsec, polysilicon formed by an excimer laser has an electron mobility exceeding 100 $cm^2$/Vsec.

The polysilicon TFT fabricated by an excimer laser crystallization has an excellent electron mobility in an ON state, however a large amount of leakage current is generated in an OFF state. Therefore, it is desirable to reduce the leakage current in the OFF state of the polysilicon TFT formed by an excimer laser crystallization.

The leakage current of the polysilicon TFT is generated due to the following reason. In the OFF state, even if a voltage corresponding to approximately 5~10V is applied between a source and a drain electrode, a high electric field is formed between the source and the drain region under a state such that a current does not flow between the source and the drain electrode. In the OFF state, an electron-hole pair is generated at a grain boundary where bonding between silicon particles is relatively weak. The generated electron-hole pair separates at the boundary, thereby producing a leakage current.

Moreover, an inner grain boundary of the polysilicon layer causes the electron mobility of the device to be lowered in both the ON and OFF states. This is because at the grain boundary, the bonding between silicon particles is cut or silicon particles are incompletely bonded to each other, which prevents the flow of electrons or holes. Thus, even if the polysilicon TFT has a higher electron mobility than that of an amorphous silicon TFT, the electron mobility of the polysilicon TFT is lower than that of a single-crystalline silicon TFT because of the grain boundary.

In order to solve these problems, the density of the grain boundary is lowered by increasing the grain size. In order to increase the grain size, an intensity of the laser energy is increased or the substrate is heated.

Referring to FIG. 1, the intensity of the laser energy is proportional to the grain size in a first region and a second region. However, a small grain corresponding to 100 nm is grown in a third region due to the following reasons.

When the laser beam irradiates the surface of the amorphous silicon layer, a portion of the surface of the amorphous silicon layer directly exposed to the laser beam is irradiated by a high intensity laser beam, and a relatively weak laser beam irradiates a lower portion of the amorphous silicon layer. Accordingly, the surface of the amorphous silicon layer directly exposed to the laser beam is completely melted while the lower portion of the amorphous silicon layer is melted incompletely. Since a grain grows centering around a seed, for example impurities or incompletely melted amorphous particles, the lower portion of the amorphous silicon in the incomplete molten state serves as a seed to grow a grain of a large size centering around the seed.

When an intensity of the laser beam is at more than a critical level, the amorphous silicon is completely melted and a seed for growing a grain does not exist. Then, in a cooling process, a seed is randomly generated in the melted amorphous silicon and the amorphous silicon is crystallized centering around the seed.

At this time, the generated grain has a very small size, as shown in the third region of FIG. 1.

In the process of cooling, the amorphous silicon is cooled through both lateral surfaces on which a laser beam has not been irradiated. This is because the solid amorphous silicon layer of the lateral surfaces has a greater heat conductivity than the amorphous silicon layer of the lower portion.

The completely melted amorphous silicon is crystallized from the unmelted amorphous silicon of the lateral surface. At this time, the unmelted amorphous silicon serves as a seed for crystallization and the crystallization is performed in a lateral direction with a certain pattern.

At a region that is not in contact with the solid amorphous silicon layer that serves as a seed in the silicon layer melted by a laser beam, a minute crystal is randomly grown in a cooling process. The minute crystal serves as a seed for a grain growth to perform crystallization.

FIG. 2 shows a state of an amorphous silicon crystallized by the above crystallization. Referring to FIG. 2, the crystallization method will be explained in more detail.

First, a part of an amorphous silicon is shielded by a mask, and then a laser beam irradiates the amorphous silicon. The amorphous silicon region shielded by the mask is not melted, but the amorphous silicon region on which a laser beam has been irradiated is completely melted and then is cooled.

The amorphous silicon melted in a cooling process is laterally crystallized by making the solid amorphous silicon of a lateral surface as a seed, and the melted amorphous silicon of a region not in contact with the solid amorphous silicon grows a small grain corresponding to several hundreds of nm centering around an arbitrary seed. The laser beam has an intensity that is strong enough to completely melt the irradiated amorphous silicon.

The crystallization is performed sequentially in a lateral direction. This is called sequential lateral solidification (SLS). As shown, the laterally grown grain has a size corresponding to 1~1.2 µm.

Whereas a grain formed by a general laser crystallization has a size corresponding to several hundreds of nanometers, a grain formed by the SLS method has a size corresponding to several micrometer (µm). Therefore, if polysilicon obtained by the SLS method is used in a device, a device having a large mobility can be realized.

When a maximum size of a grain that can be grown by the SLS method is desired, the SLS method is performed from both directions, thereby obtaining a large crystalline structure having one large grain boundary in the middle part thereof.

FIG. 3 is a view showing an aspect of a grain grown by the method.

If the SLS method is performed by using a mask including an opening having approximately 2 µm, as shown in FIG. 3, the grain has one grain boundary and a laterally grown crystalline can be obtained. If the lateral grown polycrystalline is used as a channel of a thin film transistor, the thin film transistor has a high mobility.

A method for crystallizing an amorphous silicon by using the SLS method will be explained in more detail with reference to FIG. 4.

As shown in FIG. 4A, the SLS method is performed by using a mask 401 including an opening 402 having a width W and a length L as a laser beam shielding mask. Also, the SLS method is performed by scanning a substrate 400 in an X direction and by stepping the substrate 400 in a Y direction. The SLS method is performed by scanning a substrate with a bar type laser beam and moving the entire substrate in a zigzag form.

The unit moving distance of the substrate in the X direction is called an X direction scanning distance, and the unit moving distance of the substrate in a Y direction is called a Y direction stepping distance. The scanning distance is smaller than a width of the mask to partially overlap between adjacent crystallized silicon regions Also, the stepping distance in the Y direction corresponds to a length of a mask.

Hereinafter, the related crystallization will be explained with reference to FIGS. 4A to 4C.

As shown in FIG. 4A, the mask 401 including the opening 402 having the width W and the length L is aligned on the substrate 400. The mask may be formed inside or outside a projection lens of a laser generator, and the mask is aligned on the substrate by aligning the laser generator having the mask on the substrate.

After aligning the mask 401 on the substrate 400, a first laser shot irradiates the substrate 400 through the opening 402 of the mask. As the result, as shown in FIG. 4A, a laterally crystallized silicon region having one large grain boundary in the middle part thereof is obtained.

Then, as shown in FIG. 4B, the substrate 400 is moved in a −X scanning direction. As mentioned above, the moving distance is smaller than the width W of the mask. The reason is to partially overlap between a region crystallized by the first laser shot and a region crystallized by a second laser shot after moving the substrate in the X scanning direction. A larger crystalline silicon region may be obtained by overlapping the crystallized regions.

As the result, as shown in FIG. 4B, a crystalline region having a length of W/2+A can be obtained. The A denotes a length of the overlapped region after moving the substrate with scanning.

After moving the substrate with scanning in the X direction, as shown in FIG. 4C, the substrate 400 is moved in a Y stepping direction by a stepping distance and then the SLS method is continuously performed. The stepping distance is preferably smaller than the length of the opening 402 thereby to partially overlap the crystallized regions. The reason is for removing crystalline strain due to a grain boundary generated after the crystallization.

The substrate 400 is moved by the stepping distance, and then is continuously moved in the X direction, thereby performing the crystallization.

The crystallization is performed until the substrate is entirely crystallized.

However, in the related crystallization method, the crystallization is performed by using a mask having a fixed opening and thereby it is difficult to crystallize a substrate on which unit LCD panels of various sizes are formed. That is, if the length of the unit LCD panel is longer than the length of the opening of the mask, the crystallization has to be performed by partially overlapping the crystallized regions when stepping the substrate. Also, other LCD panels arranged on the substrate can be partially crystallized, thereby creating difficulty in performing a uniform crystallization.

Also, since the mask having the opening of a fixed size is applied, the mask has to be replaced into another mask when crystallizing a unit LCD panel of another size.

SUMMARY OF THE INVENTION

Accordingly, a sequential lateral solidification (SLS) method capable of uniformly crystallizing unit liquid crystal display (LCD) panels of various sizes formed on a substrate is presented. Uniform crystallization is performed without a grain boundary in a step direction of a unit LCD panel by using the variable mask device.

By way of introduction only, in one aspect, a variable mask device for crystallizing a silicon layer comprises a frame defining an opening which is disposed between the silicon layer and a source of a laser beam and an actuator for controlling a dimension of the opening. More specifically, an X direction actuator may be used for controlling a width of the opening and a Y direction actuator may be used for controlling a length of the opening.

In another aspect, an SLS method is provided that is capable of crystallizing unit LCD panels only in an X direction by moving a substrate with scanning by using the variable mask device for crystallizing a silicon layer and capable of performing a crystallization by forming a length of an opening to be larger than a length of the unit LCD panel.

The SLS method comprises providing a substrate on which a plurality of unit LCD panels are formed; aligning a mask having a variable opening on the substrate; irradiating the silicon layer through the opening using a laser beam to crystallize the silicon layer; and moving the substrate in an X direction scanning distance, irradiating the silicon layer, and repeating the moving and irradiating until the silicon layer is entirely crystallized.

Another method for crystallizing a semiconductor layer comprises: providing a substrate on which a plurality of panels each containing the semiconductor layer are formed; aligning a mask having a variable opening over the semiconductor layer in one of the panels; and repeatedly irradiating the semiconductor layer through the opening using a laser beam to crystallize the semiconductor layer and moving at least one of the mask or the substrate after irradiating the semiconductor layer until the semiconductor layer in the one of the panels has been completely irradiated before irradiating the semiconductor layer in another of the panels.

The foregoing has been provided merely as a summary and is not intended to in any way limit the scope of the invention or its equivalents thereof.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings. As shown, a variable mask device is presented for crystallizing a silicon layer on a mother substrate on which a plurality of unit liquid crystal display (LCD) panels of different sizes are formed.

Hereinafter, a variable mask device for crystallizing a silicon layer according to the present invention will be explained with reference to FIG. 5.

Figure 1:
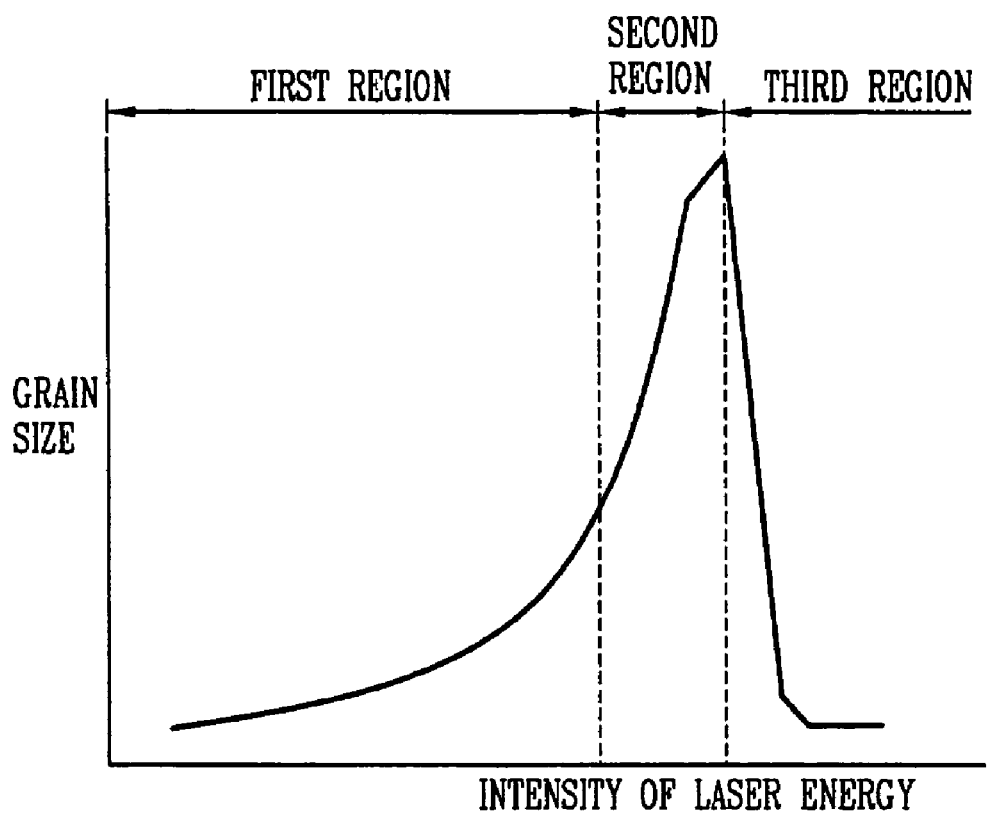
FIG. 1 is a graph showing a relation between a laser intensity and a size of a crystalline formed by the laser intensity.
Figure 2:
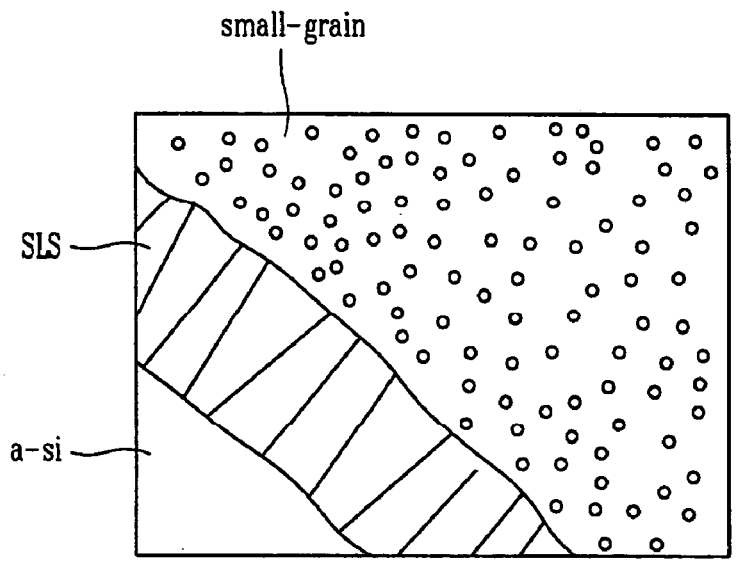
FIG. 2 is a plane view showing a laterally solidified crystalline.
Figure 3:
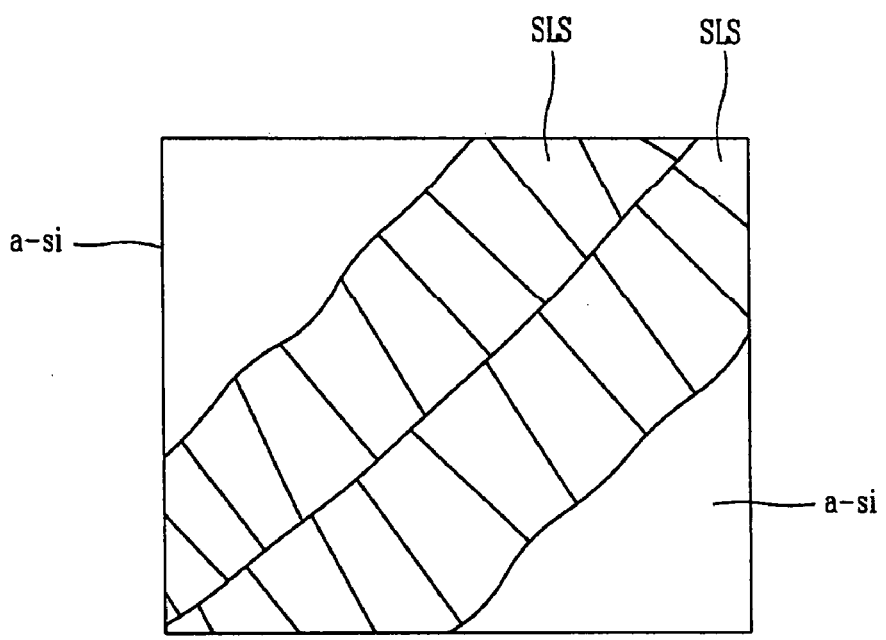
FIG. 3 is a sectional view showing a sequentially lateral solidified (SLS) crystalline using a mask.
Figure 4A:
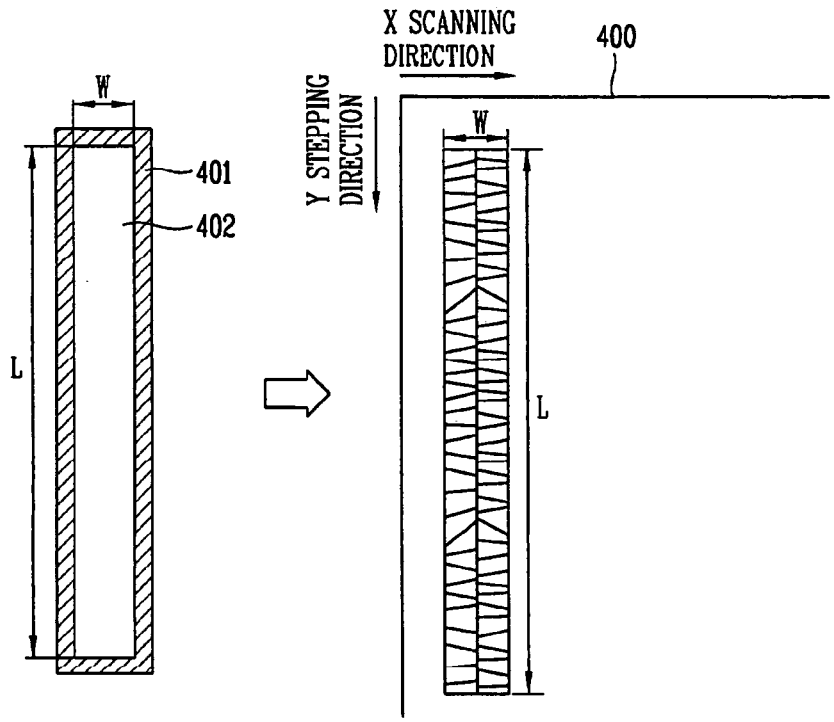
FIGS. 4A to 4C are mimetic diagrams showing a process for performing an SLS using a mask.
Figure 4B:
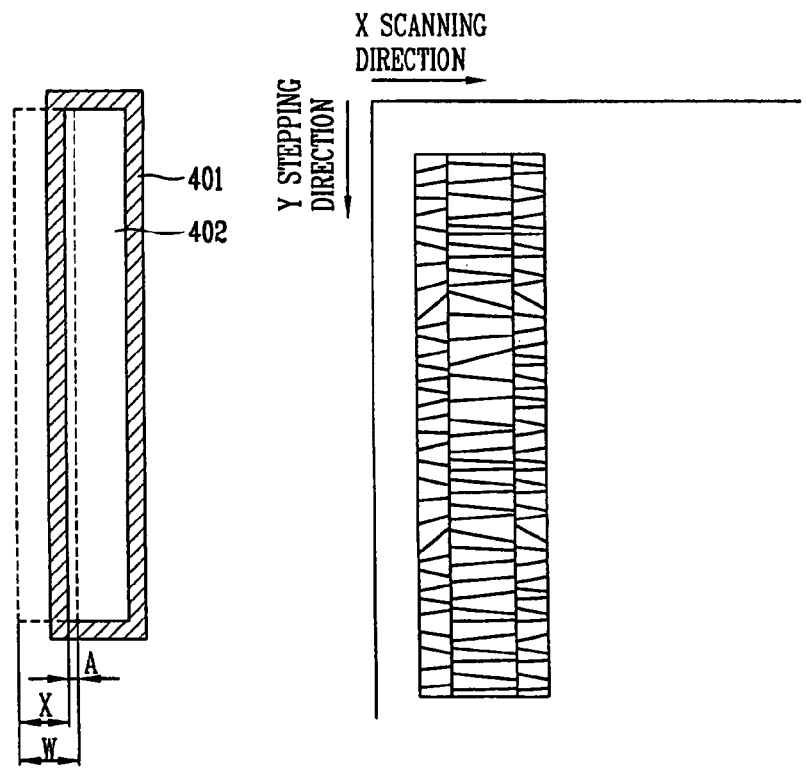
Figure 4C:
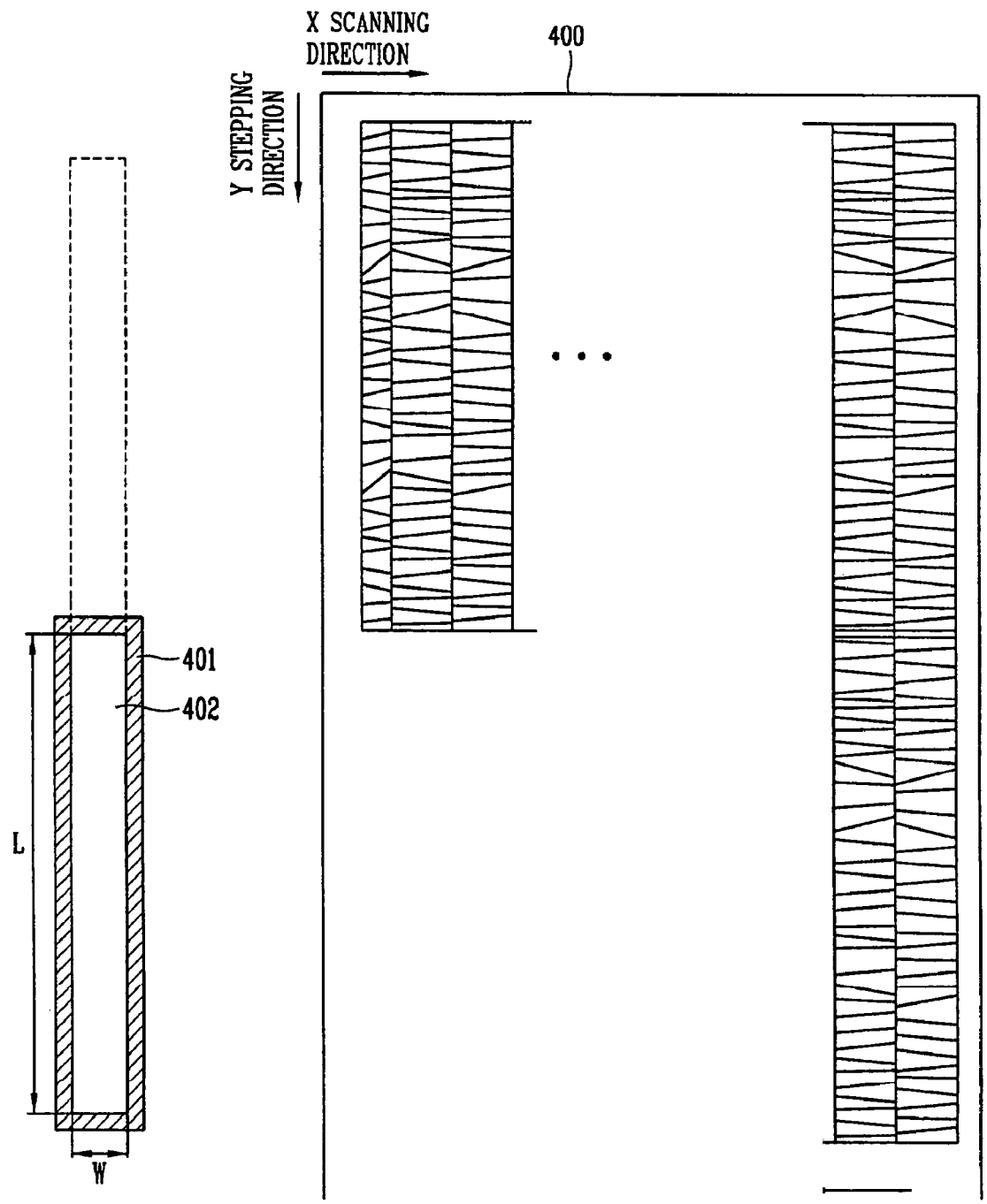
Figure 5A:
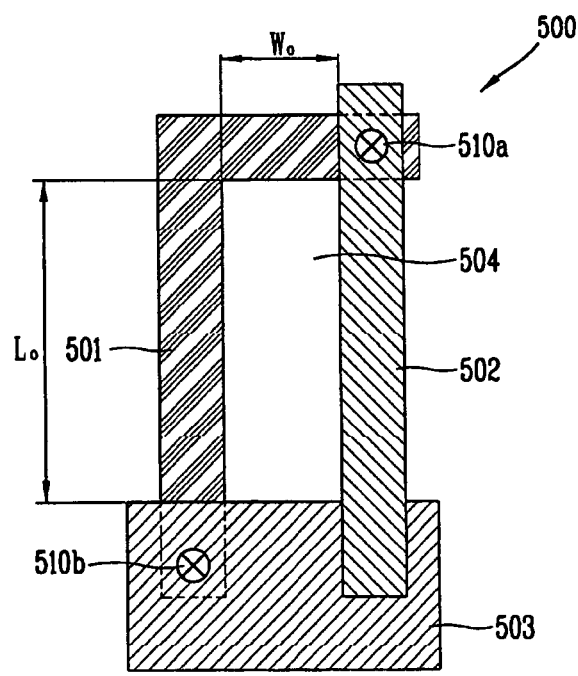
FIGS. 5A and 5B show a variable mask device for crystallizing a silicon layer according to the present invention.

As shown in FIG. 5A, a variable mask device 500 for crystallizing a silicon layer comprises a clamp shaped frame 501, and an opening 504 defined by an X direction actuator 502 and a Y direction actuator 503. The opening 504 may be constructed as a rectangular shape, and has a length Lo and a width Wo. The width of the opening 504 is controlled by the X direction actuator 502, and the length of the opening 504 is controlled by the Y direction actuator 503. The X direction actuator 502 and the Y direction actuator 503 can control the width and the length of the opening 504 in µm increments. In order to control the width and the length of the opening, the X direction actuator 502 and the Y direction actuator 503 are respectively coupled to the frame 501 by controlling units 510a and 510b.

The width Wo of the opening 504 determines a length of a grown crystalline region when applying the SLS method, and is determined within a range of 2 µm~15 µm.

A laser beam has a width corresponding to several micrometers and a length corresponding to several tens of centimeters by the variable mask device. Therefore, the length of the opening 504 is controlled up to several tens of centimeters by the Y direction actuator 503. It is also possible to permit the length of the opening 504 to be larger than a length of one side of the unit LCD panel. By permitting the length of the laser beam to be larger than the length of one side of the unit LCD panel, each unit LCD panel can be crystallized by moving the substrate only in the X direction and not moving the substrate in the Y direction.

The variable mask device determines a final shape of the beam formed by the laser generating device, and may be installed at an upper end of a projection lens of the laser beam or a lower end adjacent to the projection lens. Since the laser beam directly irradiates the variable mask device, the variable mask device is formed of an aluminum alloy, chrome, etc. or some other opaque material that is strong enough to not be damaged by the laser beam.

Figure 5B:
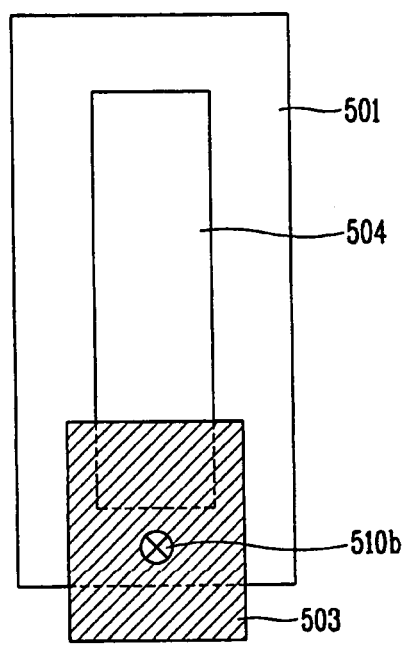

FIG. 5B shows another embodiment of the variable mask device according to the present invention. A variable mask device 500 according to the embodiment shown in FIG. 5b is provided with only a Y direction actuator 503. That is, the width of the opening 504 is preset, and only the length of the opening is controlled. This permits the unit LCD panels to be crystallized by moving a substrate only in the scanning X direction. Therefore, only the length of the opening is controlled.

A method for crystallizing an amorphous silicon layer formed on a substrate by using the variable mask device is explained with reference to FIG. 6.

Figure 6:
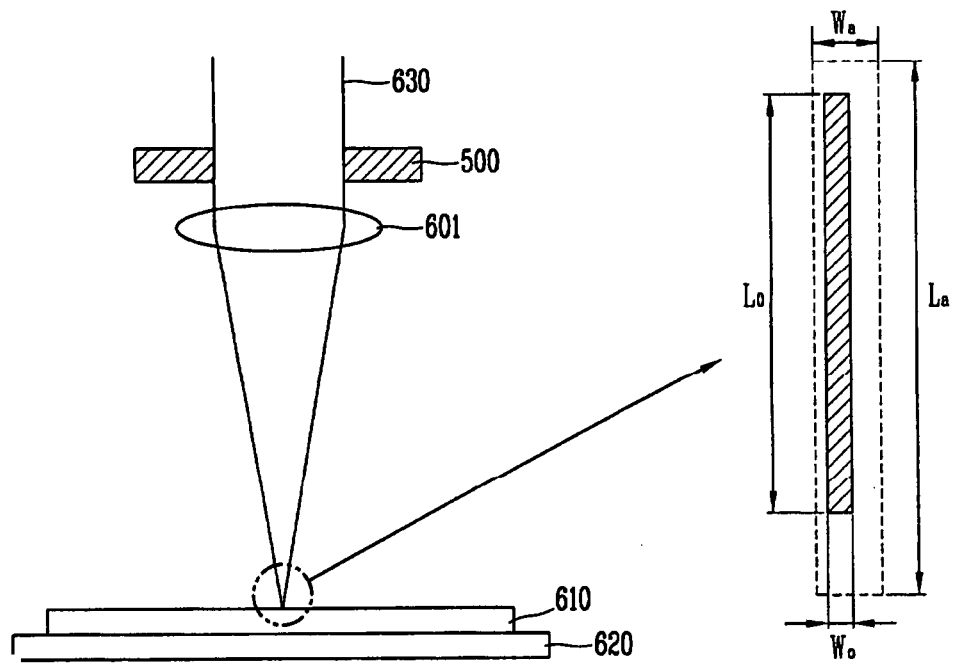
FIG. 6 is sectional view showing an SLS method using the variable mask device for crystallizing a silicon layer according to the present invention.

FIG. 6 shows a part of a laser generating device according to the present invention. Although not shown, the laser generating device according to the present invention comprises a laser generating unit (not shown), a collimator (not shown) for collecting a laser beam generated from the laser generating unit in a lateral direction and a vertical direction, an homogenizer (not shown) for deforming a sectional profile of the laser beam collected by the collimator, and a projection lens 601 for irradiating the substrate 610 with the laser beam from the equalizer.

As shown in FIG. 6, the variable mask device 500 is installed at an upper end of the projection lens 601 (although it can be installed at a lower end of the projection lens). As shown, when the variable mask device 500 is installed at the lower end of the projection lens 601, the variable mask device 500 is disposed between the projection lens 601 and the substrate 610 and when the variable mask device 500 is installed at the upper end of the projection lens 601, the projection lens 601 is disposed between the variable mask device 500 and the substrate 610. Therefore, a profile of the laser beam 630 linearly deformed by the equalizer is finally deformed by the variable mask device 500 before irradiating the substrate 610. A laser beam processed by the variable mask device 500 is a long linear laser beam.

The laser beam can irradiate the substrate 610 through the projection lens 601 in an equi-multiple state (i.e. irradiating the entire desired area of the substrate in one laser shot) or in a minimized state into 1/n times (i.e. irradiating the entire desired area of the substrate in n laser shots).

FIG. 6 shows a shape of a laser beam whose width and length are controlled. As shown in FIG. 6, the length of the linear laser beam can be varied into La from Lo, and the width thereof can be varied into Wa from Wo.

The processed laser beam irradiates unit LCD panels on the substrate, and solidifies each unit LCD panel. The substrate 610 is entirely crystallized by moving a substrate stage 620 on which the substrate 610 is loaded in X and Y directions.

The method for crystallizing each unit LCD panel will be explained with reference to FIG. 7.

Figure 7:
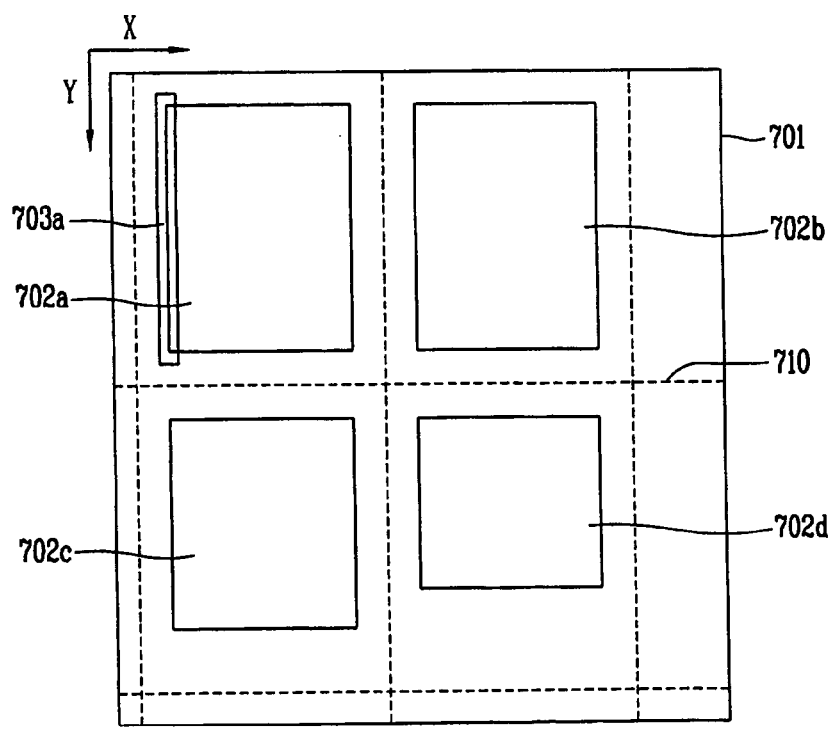
FIG. 7 is a plan view showing a method for crystallizing a substrate by using a laser beam generating device including the variable mask device for crystallizing a silicon layer according to the present invention.

FIG. 7 shows a mother substrate 701 on which unit LCD panels 702a to 702d having various sizes are formed. The unit LCD panels are respectively separated from each other by a cutting process. A dotted line 710 of FIG. 7 denotes a cutting line for cutting the unit LCD panels. In various embodiments, all or only some of the amorphous silicon layer on the substrate 701 may be crystallized. Therefore, in one embodiment, the linear laser beam is processed by the variable mask device so as to have a size larger than one side of each unit LCD panel and does not influence adjacent unit LCD panel.

As shown in FIG. 7, a laser generating device is arranged on a substrate on which a plurality of unit LCD panels are formed, and a linear laser beam 703*a* processed by a variable mask device is aligned on one side of a unit LCD panel 702*a*. The processed linear beam has a width corresponding to several pm, a length longer than that of the crystallized unit LCD panel, and a size not exceeding a size of the largest unit LCD panel formed by the cutting process.

A first laser shot is executed by the laser beam 703*a*, and then a second laser shot is executed by moving the substrate in the −x direction. The moving distance of the substrate is smaller than ½ of the width of the laser beam, thereby partially overlapping a crystalline region formed by the first laser shot and a crystalline region formed by the second laser shot. By the above method, a laterally grown single crystalline can be obtained.

Since the laser beam 703*a* is larger than one side of the unit LCD panel 702*a*, scanning only in the X direction is sufficient and stepping in the Y direction may be avoided, if desired, to crystallize each unit LCD panel. Therefore, a lateral crystalline crystallized in the X direction can be obtained in the unit LCD panel. That is, crystallization is not generated in the Y direction thereby achieving excellent crystallization.

After crystallizing a first unit LCD panel region, a second unit LCD panel region is also crystallized by the above process. If the size of the second unit LCD panel region is different from that of the first unit LCD panel region, the length and width of the variable mask device are controlled and then crystallization of the second unit LCD panel region is performed.

In the present invention, the variable mask device having a variable opening is provided to crystallize only unit LCD panels when performing the SLS method for a substrate on which unit LCD panels of different sizes are formed, thereby effectively performing the SLS method. Since the variable mask device is provided in the present invention, a mother substrate on which unit LCD panels of different sizes are arranged can be effectively crystallized. Also, crystallization of unit LCD panels is performed by processing a laser beam larger than one edge of the unit LCD panel by controlling the size of the opening. Accordingly, the unit LCD panels are crystallized by moving the substrate using only scanning in the X direction thereby obtaining an excellent crystalline material without using a step pattern.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A variable mask device for crystallizing a silicon layer of a liquid crystal display (LCD) panel, comprising:
   a frame defining an opening, the opening disposed between the silicon layer of the LCD panel and a source of a laser beam;
   actuators for controlling a dimension of the opening; and
   actuators controlling units to connect the frame with the actuators, to control respective the actuators.

2. The device of claim 1, wherein the frame has a clamp shape.

3. The device of claim 1, wherein the actuator comprises an X direction actuator and a Y direction actuator.

4. The device of claim 1, wherein the opening has a rectangular shape.

5. The device of claim 1, wherein a width of the opening, which is controlled by the actuator, is at most 15 μm.

6. The device of claim 1, wherein a length of the opening, which is controlled by the actuator, is longer than one side of a unit liquid crystal display panel formed on a substrate.

7. The device of claim 1, wherein the actuator comprising only a Y direction actuator.

* * * * *